United States Patent
Bangsaruntip et al.

(10) Patent No.: US 8,722,492 B2
(45) Date of Patent: May 13, 2014

(54) NANOWIRE PIN TUNNEL FIELD EFFECT DEVICES

(75) Inventors: Sarunya Bangsaruntip, Yorktown Heights, NY (US); Steven J. Koester, Yorktown Heights, NY (US); Amlan Majumdar, Yorktown Heights, NY (US); Jeffrey W. Sleights, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 548 days.

(21) Appl. No.: 12/684,280

(22) Filed: Jan. 8, 2010

(65) Prior Publication Data

US 2011/0168982 A1    Jul. 14, 2011

(51) Int. Cl.
- *H01L 21/336* (2006.01)
- *H01L 21/8234* (2006.01)
- *H01L 21/04* (2006.01)
- *H01L 29/06* (2006.01)

(52) U.S. Cl.
CPC .......... *H01L 21/047* (2013.01); *H01L 29/0669* (2013.01)
USPC ....................................... 438/279

(58) Field of Classification Search
CPC ............ H01L 21/02603; H01L 21/047; H01L 21/26586; H01L 29/0669; H01L 26/0676; H01L 29/413; H01L 29/66803; H01L 2221/1094; H01L 2924/13086
USPC ................... 438/197, 279, 283, 288
See application file for complete search history.

(56) References Cited

U.S. PATENT DOCUMENTS

| | | |
|---|---|---|
| 4,995,001 A | 2/1991 | Dawson et al. |
| 5,308,445 A | 5/1994 | Takasu |
| 5,438,018 A | 8/1995 | Mori et al. |
| 5,552,622 A | 9/1996 | Kimura |
| 5,574,308 A | 11/1996 | Mori et al. |
| 5,668,046 A | 9/1997 | Koh et al. |
| 6,365,465 B1 | 4/2002 | Chan et al. |
| 6,642,115 B1 | 11/2003 | Cohen et al. |

(Continued)

FOREIGN PATENT DOCUMENTS

| | | |
|---|---|---|
| EP | 217811 A1 | 4/2010 |
| KR | 20090044799 A | 5/2009 |
| WO | 02084757 A1 | 10/2002 |
| WO | WO2008069765 A1 | 6/2008 |

OTHER PUBLICATIONS

G.W. Neudeck, "An Overview of Double-Gate MOSFETs," Proceedings of 15th Biennial University/Government/Industry Microelectronics Symposium. UGIM 2003. New York, NY: IEEE, US, Jun. 30-Jul. 2, 2003., Jun. 30, 2003, pp. 214-217.

(Continued)

*Primary Examiner* — Calvin Choi
(74) *Attorney, Agent, or Firm* — Cantor Colburn LLP; Vazken Alexanian

(57) ABSTRACT

A method for forming a nanowire tunnel device includes forming a nanowire suspended by a first pad region and a second pad region over a semiconductor substrate, forming a gate structure around a channel region of the nanowire, implanting a first type of ions at a first oblique angle in a first portion of the nanowire and the first pad region, and implanting a second type of ions at a second oblique angle in a second portion of the nanowire and the second pad region.

18 Claims, 5 Drawing Sheets

(56) References Cited

U.S. PATENT DOCUMENTS

| | | | |
|---|---|---|---|
| 6,653,209 B1* | 11/2003 | Yamagata | 438/459 |
| 6,806,141 B2 | 10/2004 | Kamins | |
| 6,835,618 B1 | 12/2004 | Dakshina-Murthy et al. | |
| 6,855,606 B2* | 2/2005 | Chen et al. | 438/283 |
| 6,882,051 B2 | 4/2005 | Majumdar et al. | |
| 6,891,227 B2 | 5/2005 | Appenzeller et al. | |
| 6,903,013 B2 | 6/2005 | Chan et al. | |
| 6,996,147 B2 | 2/2006 | Majumdar et al. | |
| 7,101,762 B2 | 9/2006 | Cohen et al. | |
| 7,151,209 B2 | 12/2006 | Empedocles et al. | |
| 7,180,107 B2 | 2/2007 | Appenzeller et al. | |
| 7,211,853 B2 | 5/2007 | Bachtold et al. | |
| 7,253,060 B2 | 8/2007 | Yun et al. | |
| 7,297,615 B2 | 11/2007 | Cho et al. | |
| 7,311,776 B2 | 12/2007 | Lin et al. | |
| 7,443,025 B2 | 10/2008 | Verbist | |
| 7,446,025 B2 | 11/2008 | Cohen et al. | |
| 7,449,373 B2* | 11/2008 | Doyle et al. | 438/149 |
| 7,452,759 B2 | 11/2008 | Sandhu | |
| 7,452,778 B2 | 11/2008 | Chen et al. | |
| 7,456,068 B2 | 11/2008 | Kavalieros et al. | |
| 7,456,476 B2 | 11/2008 | Hareland et al. | |
| 7,473,943 B2 | 1/2009 | Mostarshed et al. | |
| 7,498,211 B2 | 3/2009 | Ban et al. | |
| 7,534,675 B2 | 5/2009 | Bangsaruntip et al. | |
| 7,550,333 B2 | 6/2009 | Shah et al. | |
| 7,569,941 B2 | 8/2009 | Majumdar et al. | |
| 7,642,578 B2 | 1/2010 | Lee et al. | |
| 7,791,144 B2 | 9/2010 | Chidambarrao et al. | |
| 7,795,677 B2 | 9/2010 | Bangsaruntip et al. | |
| 7,799,657 B2 | 9/2010 | Dao | |
| 7,803,675 B2 | 9/2010 | Suk et al. | |
| 7,834,345 B2* | 11/2010 | Bhuwalka et al. | 257/28 |
| 7,871,870 B2 | 1/2011 | Mostarshed et al. | |
| 7,893,506 B2 | 2/2011 | Chau et al. | |
| 8,064,249 B2 | 11/2011 | Jang et al. | |
| 8,097,515 B2 | 1/2012 | Bangsaruntip et al. | |
| 8,154,127 B1 | 4/2012 | Kamins et al. | |
| 8,338,280 B2 | 12/2012 | Tan et al. | |
| 8,541,774 B2 | 9/2013 | Bangsaruntip et al. | |
| 2004/0149978 A1 | 8/2004 | Snider | |
| 2004/0166642 A1 | 8/2004 | Chen et al. | |
| 2005/0121706 A1 | 6/2005 | Chen et al. | |
| 2005/0266645 A1 | 12/2005 | Park | |
| 2005/0275010 A1 | 12/2005 | Chen et al. | |
| 2006/0033145 A1 | 2/2006 | Kakoschke et al. | |
| 2006/0131665 A1 | 6/2006 | Murthy et al. | |
| 2006/0138552 A1 | 6/2006 | Brask et al. | |
| 2006/0197164 A1 | 9/2006 | Lindert et al. | |
| 2007/0001219 A1* | 1/2007 | Radosavljevic et al. | 257/327 |
| 2007/0267619 A1 | 11/2007 | Nirschl | |
| 2007/0267703 A1 | 11/2007 | Chong et al. | |
| 2007/0284613 A1 | 12/2007 | Chui et al. | |
| 2008/0014689 A1 | 1/2008 | Cleavelin et al. | |
| 2008/0061284 A1 | 3/2008 | Chu et al. | |
| 2008/0067495 A1 | 3/2008 | Verhulst | |
| 2008/0067607 A1 | 3/2008 | Verhulst et al. | |
| 2008/0079041 A1 | 4/2008 | Suk et al. | |
| 2008/0085587 A1 | 4/2008 | Wells et al. | |
| 2008/0121932 A1 | 5/2008 | Ranade | |
| 2008/0128760 A1 | 6/2008 | Jun et al. | |
| 2008/0135949 A1 | 6/2008 | Lo et al. | |
| 2008/0142853 A1 | 6/2008 | Orlowski | |
| 2008/0149914 A1 | 6/2008 | Samuelson et al. | |
| 2008/0149997 A1 | 6/2008 | Jin et al. | |
| 2008/0150025 A1 | 6/2008 | Jain | |
| 2008/0179752 A1 | 7/2008 | Yamauchi et al. | |
| 2008/0191196 A1 | 8/2008 | Lu et al. | |
| 2008/0224224 A1 | 9/2008 | Vandenderghe et al. | |
| 2008/0227259 A1 | 9/2008 | Avouris et al. | |
| 2008/0246021 A1 | 10/2008 | Suk et al. | |
| 2008/0247226 A1 | 10/2008 | Liu et al. | |
| 2008/0029418 A1 | 11/2008 | Kalburge | |
| 2009/0026553 A1 | 1/2009 | Bhuwalka et al. | |
| 2009/0057650 A1 | 3/2009 | Lieber et al. | |
| 2009/0057762 A1 | 3/2009 | Bangsaruntip et al. | |
| 2009/0061568 A1* | 3/2009 | Bangsaruntip et al. | 438/151 |
| 2009/0090934 A1 | 4/2009 | Tezuka et al. | |
| 2009/0134467 A1 | 5/2009 | Ishida et al. | |
| 2009/0149012 A1 | 6/2009 | Brask et al. | |
| 2009/0181477 A1 | 7/2009 | King et al. | |
| 2009/0217216 A1 | 8/2009 | Lee et al. | |
| 2009/0294864 A1 | 12/2009 | Suk et al. | |
| 2010/0140589 A1 | 6/2010 | Ionescu | |
| 2010/0193770 A1 | 8/2010 | Bangsaruntip et al. | |
| 2010/0207102 A1 | 8/2010 | Lee et al. | |
| 2011/0133169 A1 | 6/2011 | Bangsaruntip et al. | |
| 2011/0147840 A1 | 6/2011 | Cea et al. | |
| 2012/0146000 A1 | 6/2012 | Bangsaruntip et al. | |
| 2013/0001517 A1 | 1/2013 | Bangsaruntip et al. | |

OTHER PUBLICATIONS

International Search Report; International Application No. PCT/EP2010/066961; International Filing Date: Nov. 8, 2010; Date of Mailing: Feb. 10, 2011.

International Search Report; International Application No. PCT/EP2010/066483; International Filing Date: Oct. 29, 2010; Date of Mailing: Feb. 7, 2011.

International Search Report—Written Opinion; International Application No. PCT/EP2010/066483; International Filing Date: Oct. 29, 2010; Date of Mailing: Feb. 7, 2011.

International Search Report—Written Opinion; International Application No. PCT/EP2010/066961; International Filing Date: Nov. 8, 2010; Date of Mailing: Feb. 10, 2011.

Pavanello et al., "Evaluation of Triple-Gate FinFETs With SiO2-HfO2-TiN Gate Stack Under Analog Operation," Solid State Electronics, Elsevier Science Publishers, Barking, GB, vol. 51, No. 2, Mar. 7, 2007, pp. 285-291.

International Search Report—Written Opinion; International Application No. PCT/EP2011/053174; International Filing Date: Mar. 3, 2011; Date of Mailing: May 31, 2011.

International Search Report; International Application No. PCT/US2011/029304; International Filing Date: Mar. 22, 2011; Date of Mailing: May 20, 2011.

International Search Report—Written Opinion; International Application No. PCT/US2011/029304; International Filing Date: Mar. 22, 2011; Date of Mailing: May 20, 2011.

International Search Report; International Application No. PCT/US11/49501; International Filing Date: Aug. 29, 2011; Date of Mailing: Jan. 18, 2012.

International Search Report Written Opinion; International Application No. PCT/US11/49501; International Filing Date: Aug. 29, 2011; Date of Mailing: Jan. 18, 2012.

Checka, N., 'Circuit Architecture for 3D Integration', Chapter 13 in Wafer Level 3-D ICs Process Technology, ed. C.S. Tan, Springer US, 2008, ISBN 978-0-387-76534-1.

Chen et al., "An Integrated Logic Circuit Assembled ona Single Carbon Nanotube", www.sciencemag.org Science, vol. 311, Mar. 24, 2006, p. 1735.

Derycke, et al, "Carbon Nanotube Inter- and Intramolecular Logic Gates" Nano Letters, Sep. 2001, vol. 1, No. 9, pp. 453-456.

Lauhon et al., 'Epitaxial core-shell and core-multishell nanowire heterostructures', Nature, vol. 420, Nov. 7, 2002, pp. 57-61.

Office Action—Non-Final for U.S. Appl. No. 12/778,315, filed May 12, 2010; First Named Inventor: Sarunya Bangsaruntip; Mailing Date: Mar. 26, 2012.

Office Action—Non-Final for U.S. Appl. No. 12/856,718, filed Aug. 16, 2010; first Named Inventor Sarunya Bangsaruntip; Mailing Date: Jul. 9, 2012.

Office Action—Non-Final for U.S. Appl. No. 12/776,485, filed May 10, 2010; Fist Named Inventor: Sarunya Bangsaruntip; Mailing Date: Feb. 21, 2012.

Office Action—Non-Final for U.S. Appl. No. 13/372,719, filed Feb. 14, 2012; First Named Inventor: Sarunya Bangsaruntip; Mailing Date: May 7, 2012.

Office Action—Restriction Election for U.S. Appl. No. 12/776,485, filed May 10, 2010; First Named Inventor: Sarunya Bangsaruntip; Mailing Date: Dec. 9, 2011.

(56) References Cited

OTHER PUBLICATIONS

Restriction/Election Office Action for U.S. Appl. No. 12/758,939, filed Apr. 13, 2010; First Named Inventor: Sarunya Bangsaruntip; Mailing Date: Jun. 8, 2012.
Alexander J. Gates, "Designing a Nanoelectronic Circuit to Control a Millimeter-scale Walking Robot," Mitre Technical Paper, Aug. 2004, http://www.mitre.org/work/tech_papers/tech_papers_04/04_1248/04_1248.pdf.
Andriotis et al., Realistic nanotube-metal contact configuration for molecular electronics applications, IEEE Sensors Journal, vol. 8, No. 6, Jun. 2008.
R. Bahar, 'Trends and Future Directions in Nano Structure Based Computing and Fabrication', ICCD 2006, International Conf. on Computer Design, Oct. 1-4, 2007, pp. 522-527.
Buddharaju et al., 'Gate-All-Around Si-Nanowire CMOS Inverter Logic Fabricated Using Top-Down Approach', European Solid-State Device Research Conference, Sep. 11-11, 2007, pp. 303-306.
Chen et al., 'Demonstration of Tunneling FETs Based on Highly Scalable Verticle Silicon Nanowires', IEEE Electron Device Letters, vol. 30, No. 7, Jul. 2009, pp. 754-756.
Ernst et al., "3D Multichannels and Stacked Nanowires Technologies for New Design Opportunities in Nanoelectronics," IEEE International Conference on Integrated Circuit Design and Technology and Tutorial, 2008. ICICDT 2008. Jun. 2-4, 2008 pp. 265-268.
Hu et al., 'Fringing field effects on electrical resistivity of semiconductor nanowire-metal contacts', Applied Physics Letters 92, 083503_2008, Feb. 27, 2008.
Jie Xiang et al., "Ge/Si Nanowire Heterostructures as High-Performance Field-Effect Transistors," Nature 441, 489-493 (May 25, 2006).
Knoch et al., 'Tunneling phenomena in carbon nanotube field-effect transistors', Phys Stat Sol. (a) 205, No. 4, 679-694 (2008).
Leonard et al., 'Size-dependent effects on electrical contacts to nanotubes and nanowires', Phys Rev Lett., Jul. 14, 2006; 97(2):026804.
M. M. Ziegler et al., "The CMOS/NANO Interface from a Circuits Perspective," ISCAS '03. Proceedings of the 2003 International Symposium on Circuits and Systems, 2003, May 25-28, 2003, vol. 4, pp. IV-904-IV-907.
M. T. Bjork et al., "Silicon Nanowire Tunneling Field-Effect Transistors," Applied Physics Letters 92, 193504 (2008).
Ma et al., 'High-performance nanowire complementary metal-semiconductor inverters', Applied Physics Letters 93, 053105_2008, Aug. 6, 2008.
Saumitra Raj Mehrotra, A Simulation Study of Silicom Nanowire Field Effect Transistors (FETs), University of Cincinnati, Jul. 2007.
Singh et al., 'Si, SiGe Nanowire Devices by Top-Down Technology and Their Applications', IEEE Transactions on Electron Devices, vol. 55, No. 11, Nov. 2008, pp. 3107-3118.
Taichi Su et al., New Planar Self-Aligned Double-Gate Fully Depleted P-MOSFET's Using Epitaxial Lateral Overgrowth (ELO) and Selectively Grown Source/Drain (S/D), Oct. 2000.
N. Checka, 'Circuit Architecture for 3D Integration', Chapter 13 in Wafer Level 3-D ICs Process Technology, ed. C.S. Tan, Springer US, 2008, ISBN 978-0-387-76534-1.
Transmittal and International Preliminary Report on Patentability for International Application No. PCT/US2011/029304; International Filing Date: Mar. 3, 2011; date of mailing Oct. 26, 2012, 2 pages.
Notice of Allowance for U.S. Appl. No. 12/776,485, filed May 10, 2010; First Named Inventor: Sarunya Bansaruntip; Mailing Date: Sep. 26, 2012.
Office Action—Final for U.S. Appl. No. 13/372,719, filed Feb. 14, 2012; First Named Inventor: Sarunya Bangsaruntip; Mailing Date: Sep. 4, 2012.
Office Action—Non-Final for U.S. Appl. No. 12/631,199, filed Dec. 4, 2009; First Named Inventor: Sarunya Bangsaruntip; Mailing Date: Jun. 13, 2012.

Office Action—Non-Final for U.S. Appl. No. 12/856,718, filed Aug. 16, 2010; First Named Inventor: Sarunya Bangsaruntip; Mailing Date: Jun. 13, 2012.
Office Action—Restriction-Election for U.S. Appl. No. 12/856,718; filed Aug. 16, 2010; First Named Inventor: Sarunya Bangsaruntip; Mailing Date: Apr. 9, 2012.
Written Opinion for International Application No. PCT/US2011/029304; International Filing Date: Mar. 22, 2011; mailing date: May 20, 2011; 5 pages.
Chen et al., 'Demonstration of Tunneling FETs Based on Highly Scalable Verticle Silicon Nanowires', IEEE Electron Device Letters, vol. 30, No. 1, Jul. 2009, pp. 754-7556.
Transmittal and International Preliminary Report on Patentability for Interational Application No. PCT/US2011/029304; International Filing Date: Mar. 22, 2011; date of mailing Oct. 26, 2012, 2 pages.
Notice of Allowance for U.S. Appl. No. 12/776,485, filed May 10, 2010; First Named Inventor: Sarunya Bangsaruntip; Mailing Date: Sep. 26, 2012.
Office Action—Notice of Allowance for U.S. Appl. No. 13/551,995, filed Jul. 18, 2012; First Named Inventor: Sarunya Bangsaruntip; Mailing Date: Jul. 15, 2013; 13 pages.
International Search Report; International Application No. PCT/EP2011/053174; International Filing Date: Mar. 3, 2011; Date of Mailing: May 31, 2011.
Office Action—Final for U.S. Appl. No. 12/856,718, filed Aug. 16, 2010; First Named Inventor: Sarunya Bangsaruntip; Date of Mailing: Dec. 13, 2012.
Office Action—Final for U.S. Appl. No. 13/551,995, filed Jul. 18, 2012; First Named Inventor: Sarunya Bangsaruntip; Mailing Date: Apr. 30, 2013; 11 pgs.
Office Action—Non-Final for U.S. Appl. No. 13/550,700; filed Jul. 17, 2012; First Named Inventor: Sarunya Bangsaruntip; Mailing Date: Apr. 25, 2013; 27 pgs.
Office Action—Non-Final for U.S. Appl. No. 13/556,300, filed Jul. 24, 2012; First Named Inventor: Saryunya Bangsaruntip; Mailing Date: Dec. 10, 2012.
Office Action—Non-Final for U.S. Appl. No. 13/600,585, filed Aug. 31, 2012; First Named Inventor: Sarunya Bangsaruntip; Mailing Date: Dec. 13, 2012.
Office Action—Non-Final for U.S. Appl. No. 13/551,995, filed Jul. 18, 2012; First Named Inventor: Sarunya Bangsaruntip; Mailing Date: Dec. 19, 2012.
Office Action—Non-Final for U.S. Appl. No. 13/372,719, filed Dec. 4, 2012; First Named Inventor: Sarunya Bangsaruntip; Mailing Date: Jun. 13, 2012.
Office Action—Non-Final for U.S. Appl. No. 13/372,719, filed Feb. 14, 2012; First Named Inventor: Sarunya Bangsaruntip; Mailing Date: Jul. 5, 2013, 29 pgs.
Office Action—Non-Final for U.S. Appl. No. 13/372,714, filed Feb. 14, 2012; First Named Inventor: Sarunya Bangsaruntip et al.; Mailing Date: Sep. 20, 2012.
Office Action—Non-Final for U.S. Appl. No. 13/372,719, filed Feb. 14, 2012; First Named Inventor: Sarunya Bangsaruntip; Mailing Date: Sep. 4, 2012.
Office Action—Non-Final for U.S. Appl. No. 12/884,707, filed Sep. 17, 2012; First Named Inventor: Sarunya Bangsaruntip et al.; Mailing Date: Oct. 2, 2012.
Office Action—Restriction-Election for U.S. Appl. No. 12/856,718, filed Aug. 16, 2010; First Named Inventor: Sarunya Bangsaruntip; Mailing Date: Apr. 9, 2012.
Office Action—Restriction-Election for U.S. Appl. No. 12/776,485, filed May 10, 2012; First Named Inventor: Sarunya Bangsaruntip; Mailing Date: Dec. 9, 2011.
Restriction/Election Office Action for U.S. Appl. No. 12/758,939, filed Apr. 13, 2010; First Named Inventor: Sarunya Bansaruntip; Mailing Date: Jun. 8, 2012.

* cited by examiner

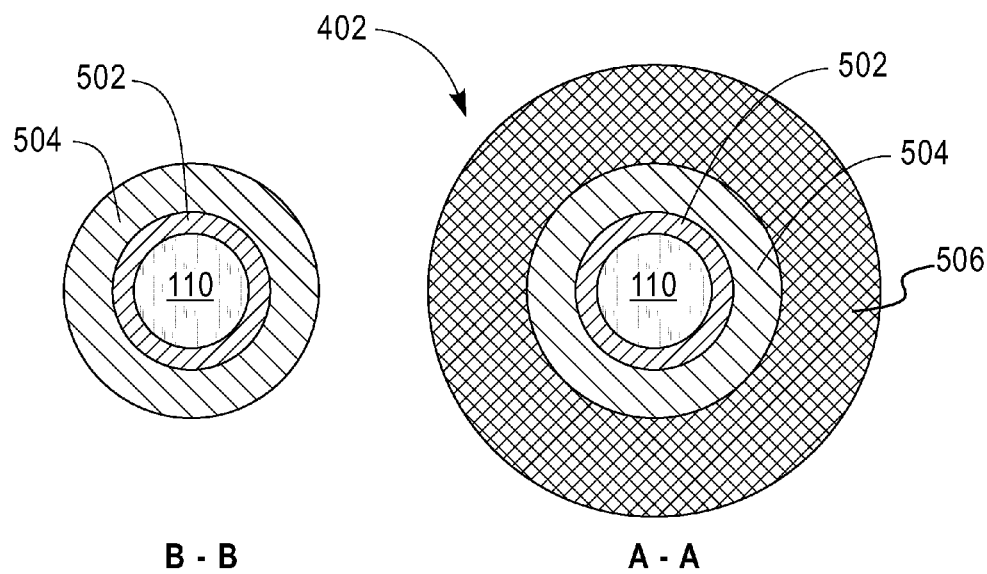
B - B
FIG. 5B
A - A
FIG. 5A
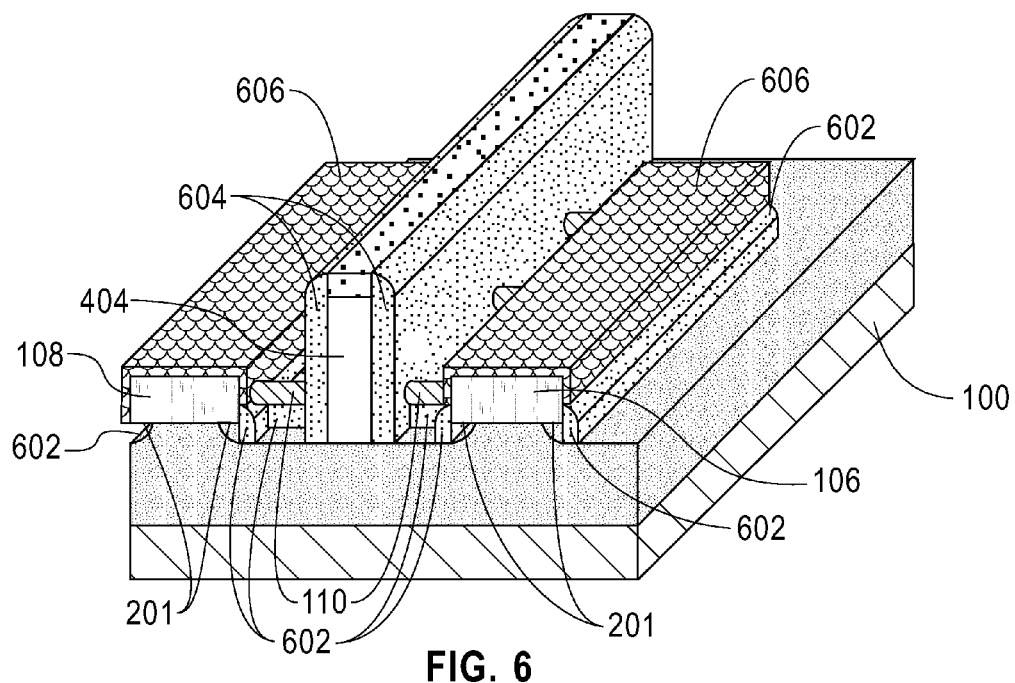
FIG. 6

NANOWIRE PIN TUNNEL FIELD EFFECT DEVICES

FIELD OF INVENTION

The present invention relates to semiconductor nanowire tunnel devices.

DESCRIPTION OF RELATED ART

PIN (p-type semiconductor-intrinsic semiconductor-n-type semiconductor) tunnel field effect transistor (FET) devices include an intrinsic semiconductor channel region disposed between a p-typed doped semiconductor region and an n-typed doped semiconductor region that contact the channel region.

BRIEF SUMMARY

In one aspect of the present invention, a method for forming a nanowire tunnel device includes forming a nanowire suspended by a first pad region and a second pad region over a semiconductor substrate, forming a gate structure around a channel region of the nanowire, implanting a first type of ions at a first oblique angle in a first portion of the nanowire and the first pad region, and implanting a second type of ions at a second oblique angle in a second portion of the nanowire and the second pad region.

In another aspect of the present invention, a nanowire tunnel device includes a nanowire suspended above a semiconductor substrate by a first pad region and a second pad region, the nanowire having a channel portion surrounded by a gate structure disposed circumferentially around the nanowire, an n-type doped region including a first portion of the nanowire adjacent to the channel portion, and a p-type doped region including a second portion of the nanowire adjacent to the channel portion.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-9 illustrate an exemplary method for forming a nanowire device.

DETAILED DESCRIPTION

Figure 1:
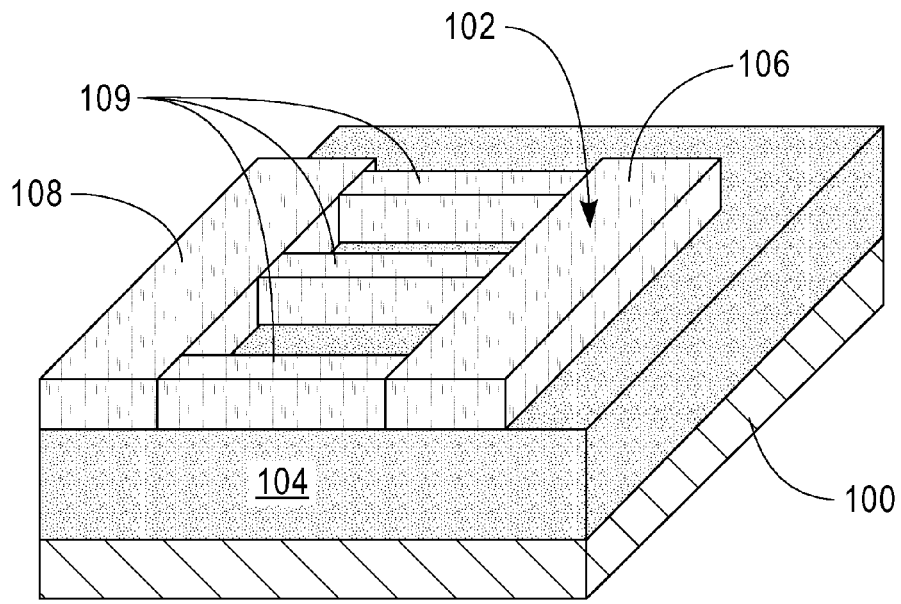

With reference now to FIG. 1, a silicon on insulator (SOI) portion 102 is defined on a buried oxide (BOX) layer 104 that is disposed on a silicon substrate 100. The SOI portion 102 includes an SOI pad region 106, an SOI pad region 108, and nanowire portions 109. The SOI portion 102 may be patterned by the use of lithography followed by an etching process such as, for example, reactive ion etching (RIE).

Figure 2:
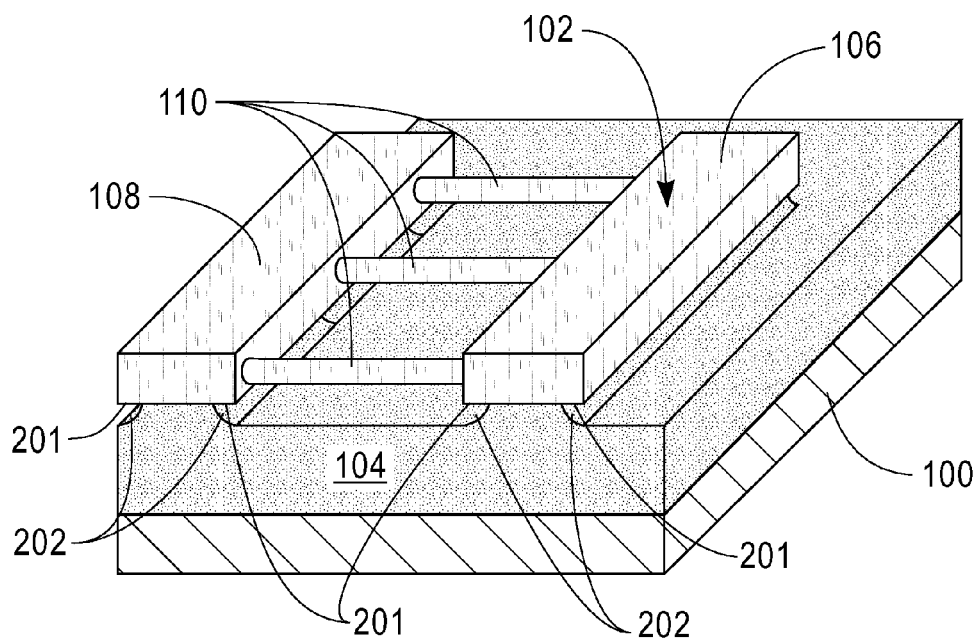

FIG. 2 illustrates the resultant BOX layer 104 and SOI portion 102 following an isotropic etching process. The BOX layer 104 is recessed in regions not covered by SOI portion 102. The isotropic etching results in the lateral etching of portions of the BOX layer 104 that are under the SOI portion 102. The lateral etch suspends the nanowire portions 109 above the BOX layer 104. The lateral etch forms the undercuts 202 in the BOX layer 104 and overhang portions 201 at the edges of SOI regions 106 and 108. The isotropic etching of the BOX layer 104 may be, for example, performed using a diluted hydrofluoric acid (DHF). A 100:1 DHF etches about 2 to 3 nm of BOX layer 104 per minute at room temperature. Following the isotropic etching the nanowires portions 109 are smoothed to form nanowires 110 with for example, elliptical or circular cross sections that are suspended above the BOX layer 104 by the SOI pad region 106 and the SOI pad region 108. The smoothing of the nanowires may be performed by, for example, annealing of the nanowires 109 in hydrogen. Example annealing temperatures may be in the range of 600° C.-900° C., and a hydrogen pressure of approximately 7 to 600 Torr.

Figure 3:
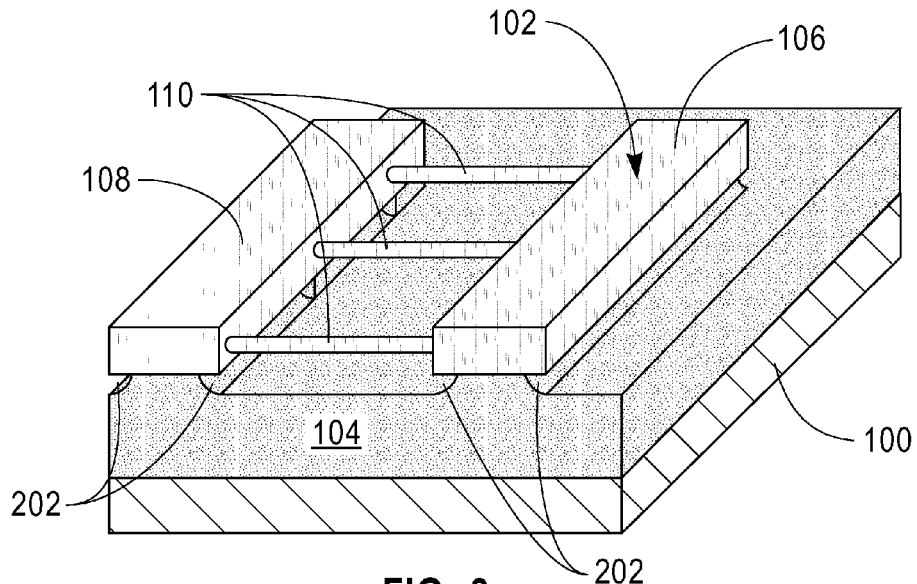

FIG. 3 illustrates the nanowires 110 following an oxidation process that may be performed to reduce the cross-sectional area of the nanowires 110. The reduction of the cross-sectional area of the nanowires 110 may be performed by, for example, an oxidation of the nanowires 110 followed by the etching of the grown oxide. The oxidation and etching process may be repeated to achieve a desired nanowire 110 cross-sectional area. Once the desired cross-sectional area of the nanowires 110 have been reached, gates are formed over the channel regions of the nanowires 110 (described below).

Figure 4:
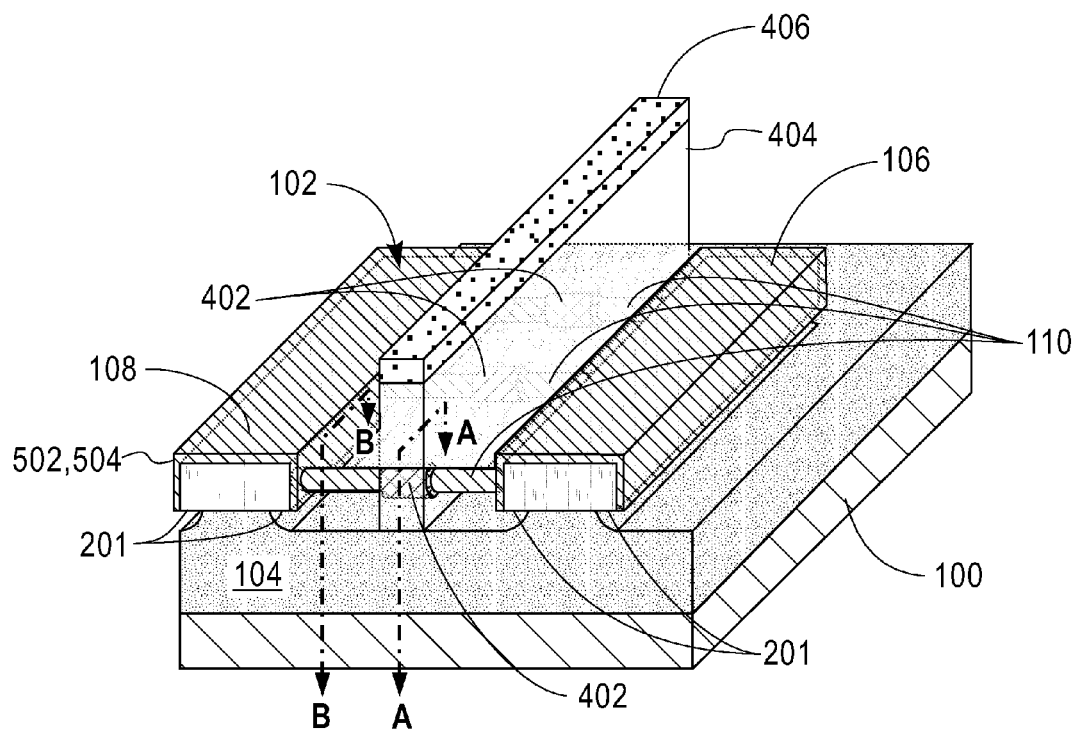

FIG. 4 illustrates gates 402 that are formed around the nanowires 110, as described in further detail below, and capped with a polysilicon layer (capping layer) 404. A hardmask layer 406, such as, for example silicon nitride ($Si_3N_4$) is deposited over the polysilicon layer 404. The polysilicon layer 404 and the hardmask layer 406 may be formed by depositing polysilicon material over the BOX layer 104 and the SOI portion 102, depositing the hardmask material over the polysilicon material, and etching by RIE to form the polysilicon layer 404 and the hardmask layer 406. The etching of the gate 402 may be performed by directional etching that results in straight sidewalls of the gate 402. Following the directional etching, polysilicon 404 remains under the nanowires 110 and outside the region encapsulated by the gate 402. Isotropic etching may be performed to remove polysilicon 404 from under the nanowires 110.

FIG. 5A illustrates a cross-gate 402 sectional view of a gate 402 along the line A-A (of FIG. 4). The gate 402 is formed by depositing a first gate dielectric layer (high K layer) 502, such as silicon dioxide ($SiO_2$) around the nanowire 110, and the SOI pad regions 106 and 108. A second gate dielectric layer (high K layer) 504 such as, for example, hafnium oxide ($HfO_2$) is formed around the first gate dielectric layer 502. A metal layer 506 such as, for example, tantalum nitride (TaN) is formed around the second gate dielectric layer 504. The metal layer 506 is surrounded by polysilicon layer 404 (of FIG. 4A). Doping the polysilicon layer 404 with impurities such as boron (p-type), or phosphorus (n-type) makes the polysilicon layer 404 conductive. The metal layer 506 is removed by an etching process such as, for example, RIE from the nanowire 110 that is outside of the channel region and the SOI pad regions 106 and 108, and results in the gate 402 and nanowire 110 having the first gate dielectric layer (high K layer) 502, around the nanowire 110 and the second gate dielectric layer (high K layer) 504 formed around the first gate dielectric layer 502. FIG. 5B illustrates a cross sectional view of a portion of the nanowire 110 along the line B-B (of FIG. 4).

FIG. 6 illustrates the spacer portions 604 formed along opposing sides of the polysilicon layer 404. The spacers are formed by depositing a blanket dielectric film such as silicon nitride and etching the dielectric film from the horizontal surfaces by RIE. The spacer walls 604 are formed around portions of the nanowire 110 that extend from the polysilicon layer 404 and surround portions of the nanowires 110. FIG. 6 includes spacer portions 602 that are formed under the nanowires 110, and in the undercut regions 202 (of FIG. 2). Following the formation of the spacer portions 604, the high K layers 502 and 504 may be removed by, for example, a selective etching process, and silicon may be epitaxially grown on the exposed nanowires 110 and SOI pad regions 106 and 108. The epitaxially grown silicon (epi-silicon) 606 layer increases the diameter of the nanowires 110 and the dimensions of the SOI pad regions 106 and 108. The epi-silicon 606 may be formed by epitaxially growing, for example, silicon (Si), a silicon germanium (SiGe), or germanium (Ge). As an example, a chemical vapor deposition (CVD) reactor may be used to perform the epitaxial growth. Precursors for silicon epitaxy include $SiCl_4$, $SiH_4$ combined with HCL. The use of chlorine allows selective deposition of silicon only on exposed silicon surfaces. A precursor for SiGe may be $GeH_4$, which may obtain deposition selectivity without HCL. Deposition temperatures may range from 550° C. to 1000° C. for pure silicon deposition, and as low as 300° C. for pure Ge deposition.

Figure 7:
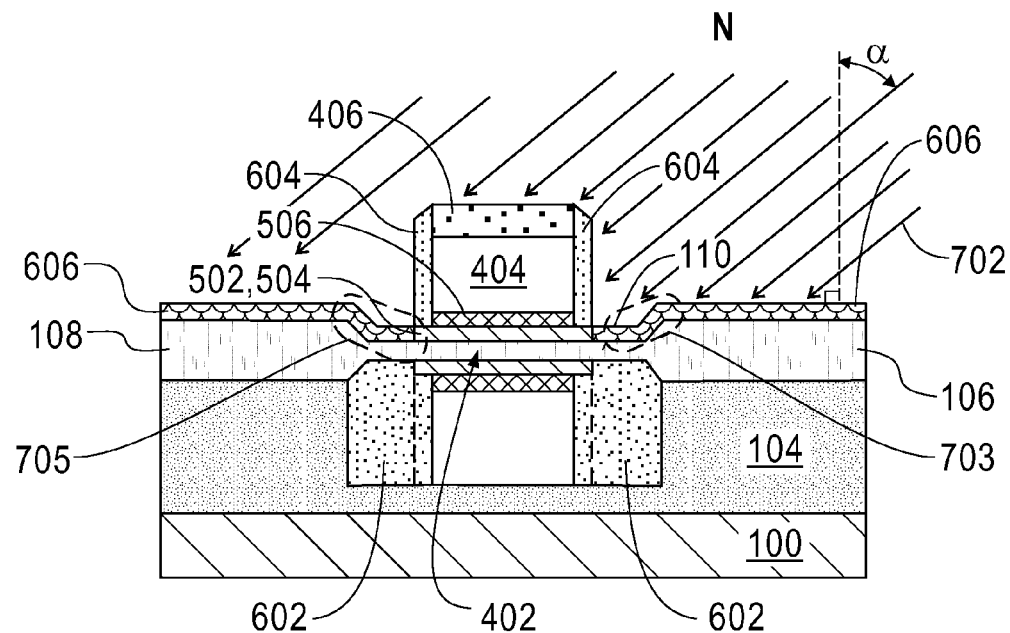

FIG. 7 illustrates a cross-sectional view of FIG. 6 following the formation of the spacers 604 and the epi-silicon 606. In the illustrated embodiment, regions of the exposed epi-silicon 606 are doped with n-type ions 702 that are implanted at an angle ($\alpha$), the angle $\alpha$ may, for example, range from 5-50 degrees. The implantation of the n-type ions 702 at the angle $\alpha$ exposes the SOI pad regions 106 and 108 and the nanowire 110 one side of the device to the n-type ions 702 to form an n-type doped region 703 in the epi-silicon 606 adjacent to the gate 402, while a region 705 of the opposing side remains unexposed to the n-type ions 702 due to the height and position of the polysilicon layer 404, the spacers 604, and the hardmask layer 406.

Figure 8:
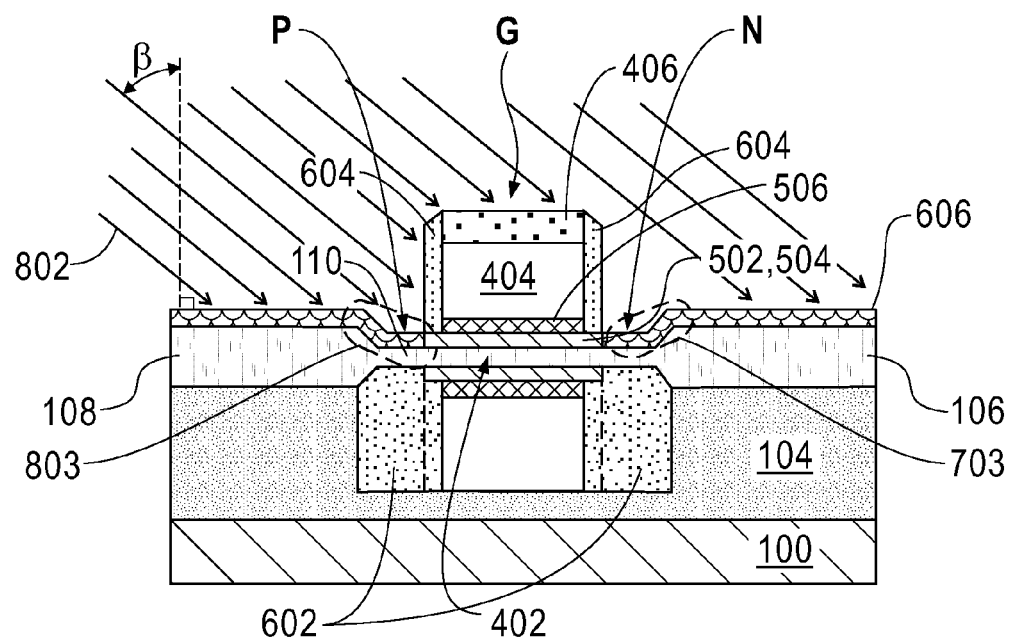

FIG. 8 illustrates a cross-sectional view of the device. In the illustrated embodiment regions of the exposed epi-silicon 606 are implanted with p-type ions 802 at an angle ($\beta$); the angle $\beta$ may, for example, range from 5-50 degrees. The implantation of the ions 802 at the angle $\beta$ in the epi-silicon 606 on the SOI pad regions 108 and 106 and the adjacent nanowire 110 form a p-type doped region 803 in the region 705 (of FIG. 7) adjacent to the gate 402; while the opposing (n-type doped region 703) remains unexposed to the p-type ions 802. Portions of the SOI pad regions 106 and 108 that do not include the regions 703 and 803 may include both n-type and p-type ions; the regions with both types of ions do not appreciably effect the operation of the device.

Once the ions 702 and 802 are implanted, an annealing process is performed to overlap the device and activate the dopants. The annealing process results in a shallow doping gradient of n-type ions and p-type ions in the channel region of the device.

Figure 9:
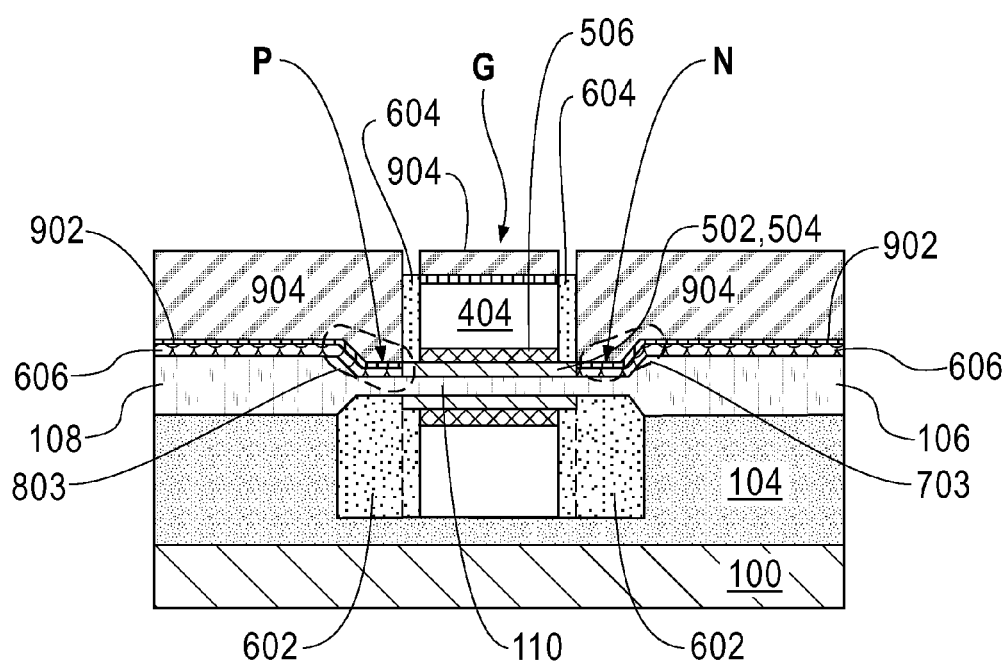

FIG. 9 illustrates the resultant structure following silicidation where a silicide 902 is formed on the over the polysilicon layer 404 (the gate region G) and over the n-type doped region (N) 703 and the p-typed doped region (P) 803. Examples of silicide forming metals include Ni, Pt, Co, and alloys such as NiPt. When Ni is used the NiSi phase is formed due to its low resistivity. For example, formation temperatures include 400-600° C. Once the silicidation process is performed, capping layers and vias for connectivity (not shown) may be formed and a conductive material such as, Al, Au, Cu, or Ag may be deposited to form contacts 904.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a nanowire tunnel device, the method comprising:
    forming a nanowire suspended by a first pad region and a second pad region over a semiconductor substrate;
    forming a gate structure around a channel region of the nanowire;
    implanting a first type of ions at a first oblique angle simultaneously in a first portion of the nanowire, the first pad region, and a portion of the second pad region; and
    implanting a second type of ions at a second oblique angle in a second portion of the nanowire and the second pad region.

2. The method of claim 1, wherein the method further comprises forming a protective spacer adjacent to sidewalls of the gate structure and around portions of the nanowire extending from the gate structure, following the formation of the gate structure.

3. The method of claim 1, wherein the first portion of the nanowire, the second portion of the nanowire, the first pad region, and the second pad region are silicon material.

4. The method of claim 1, wherein the first portion of the nanowire, the second portion of the nanowire, the first pad region, and the second pad region include epitaxially grown material.

5. The method of claim 1, wherein the method further includes forming a silicide material on the first pad region, the second pad region, the first portion of the nanowire, the second portion of the nanowire, and the gate structure.

6. The method of claim 1, wherein the method further includes forming conductive contacts on the first pad region, the second pad region, the first portion of the nanowire, the second portion of the nanowire, and the gate structure.

7. The method of claim 1, wherein the first type of ions are n-type ions.

8. The method of claim 1, wherein the second type of ions are p-type ions.

9. The method of claim 1, wherein the first type of ions are n-type ions and the second type of ions are p-type ions.

10. The method of claim 1, wherein the first oblique angle is dissimilar from the second oblique angle.

11. The method of claim 1, wherein the first oblique angle (α) is between 5 and 50 degrees relative to a normal line from the semiconductor substrate.

12. The method of claim 11, wherein the first oblique angle is dissimilar from the second oblique angle.

13. The method of claim 1, wherein the second oblique angle (β) is between 5 and 50 degrees relative to a normal line from the semiconductor substrate.

14. The method of claim 4, wherein the epitaxially grown material is a doped silicon material.

15. The method of claim 4, wherein the epitaxially grown material is a doped a SiGe alloy material.

16. The method of claim 4, wherein the epitaxially grown material is a doped Ge material.

17. The method of claim 1, wherein the gate structure includes a silicon oxide layer disposed on a channel portion of the nanowire, a dielectric layer disposed on the silicon oxide layer, and a metal layer disposed on the dielectric layer.

18. The method of claim 2, wherein the protective spacer includes a nitride material.

* * * * *